(12) United States Patent
Gustavsson et al.

(10) Patent No.: US 8,659,354 B2
(45) Date of Patent: Feb. 25, 2014

(54) POWER-AMPLIFIER ARRANGEMENT

(75) Inventors: Ulf Gustavsson, Göteborg (SE);
Thomas Lejon, Vallentuna (SE); Johan Thorebäck, Sundbyberg (SE)

(73) Assignee: Telefonaktiebolaget L M Ericsson (publ), Stockholm ( * ) Notice: Subject to any disclaimer, the term of this patent is extended or adjusted under 35 U.S.C. 154(b) by 0 days.

(21) Appl. No.: 13/581,556

(22) PCT Filed: Apr. 14, 2010

(86) PCT No.: PCT/SE2010/050398
§ 371 (c)(1),
(2), (4) Date: Aug. 28, 2012

(87) PCT Pub. No.: WO2011/129727
PCT Pub. Date: Oct. 20, 2011

(65) Prior Publication Data
US 2013/0021095 A1  Jan. 24, 2013

(51) Int. Cl.
H03F 3/68 (2006.01)
(52) U.S. Cl.
USPC .................. 330/124 R; 330/295; 330/10
(58) Field of Classification Search
USPC ...................... 330/124 R, 295, 10
See application file for complete search history.

(56) References Cited

U.S. PATENT DOCUMENTS

| | | | |
|---|---|---|---|
| 4,580,111 A | 4/1986 | Swanson | |
| 5,861,776 A | 1/1999 | Swanson | |
| 6,147,553 A | 11/2000 | Kolanek | |
| 6,853,244 B2 * | 2/2005 | Robinson et al. | 330/51 |
| 6,998,910 B2 * | 2/2006 | Hezar et al. | 330/10 |
| 7,310,382 B2 * | 12/2007 | Fonden et al. | 375/297 |
| 7,312,654 B2 * | 12/2007 | Roeckner et al. | 330/10 |
| 7,539,269 B2 * | 5/2009 | Vadde et al. | 375/297 |
| 7,920,082 B2 * | 4/2011 | Kawai et al. | 341/131 |
| 8,208,878 B1 * | 6/2012 | Hardy et al. | 455/127.5 |
| 2008/0290938 A1 | 11/2008 | Gupta | |

FOREIGN PATENT DOCUMENTS

WO  9214325 A1  8/1992
WO  2005015732 A2  2/2005

OTHER PUBLICATIONS

Hung, Tsai-Pi et al, "Design of H-Bridge Class-D Power Amplifiers for Digital Pulse Modulation Transmitters," IEEE Transactions on Microwave Theory and Techniques, vol. 55, No. 12, pp. 2845-2855, Dec. 2007.

* cited by examiner

Primary Examiner — Patricia Nguyen
(74) Attorney, Agent, or Firm — Murphy, Bilak & Homiller, PLLC

(57) ABSTRACT

A power-amplifier arrangement (35) is disclosed. The power-amplifier arrangement (35) comprises a pulse modulator (40) adapted to receive a digital input signal of the power-amplifier arrangement (35) and generate, based on the digital input signal of the power-amplifier arrangement (35), an output signal of the pulse modulator (40) with a plurality of quantization levels. The pulse modulator has a plurality of output ports ($50\_1$-$50\_n$) for representing the output signal of the pulse modulator (40). Each output port ($50\_1$-$50\_n$) of the pulse modulator (40) is associated with a unique one of the quantization levels such that a signal output on the output port ($50\_1$-$50\_n$) adopts a first state when the output signal of the pulse modulator (40) equals or exceeds the associated quantization level, or, otherwise, a second state. A related radio-transmitter circuit and a related radio-communication apparatus are also disclosed.

11 Claims, 3 Drawing Sheets

POWER-AMPLIFIER ARRANGEMENT

TECHNICAL FIELD

The present invention relates to a power-amplifier arrangement, and a radio-transmitter circuit and a radio-communication apparatus comprising the power-amplifier arrangement.

BACKGROUND

Power amplifiers are utilized in radio-transmitter circuits for generating a signal with relatively high power to be fed into an antenna. In order e.g. to avoid excessive energy consumption and/or to avoid unnecessary dissipation of heat, a relatively high efficiency is normally desired.

One way of obtaining relatively high efficiency is to use one-bit modulation in combination with a switched-mode power amplifier. However, the use of one-bit modulation introduces a relatively large amount of quantization noise. To counteract the quantization noise, the switched-mode power amplifier may be connected to a load via a band-pass reconstruction filter, the purpose of which is to filter out at least part of the quantization noise power. The band-pass reconstruction filter normally presents a load to the amplifier that varies with the duty-cycle. Since power amplifiers are normally matched for high efficiency at peak output power, this typically results in that the efficiency will drop for low duty cycles.

SUMMARY

An object of the present invention is to provide a power-amplifier arrangement with relatively high efficiency.

According to a first aspect, there is provided a power-amplifier arrangement. The power-amplifier arrangement comprises a pulse modulator adapted to receive a digital input signal of the power-amplifier arrangement and generate, based on the digital input signal of the power-amplifier arrangement, an output signal of the pulse modulator with a plurality of quantization levels. The pulse modulator has a plurality of output ports for representing the output signal of the pulse modulator. Each output port of the pulse modulator is associated with a unique one of the quantization levels such that a signal output on the output port adopts a first state when the output signal of the pulse modulator equals or exceeds the associated quantization level, or otherwise adopts a second state. Furthermore, the power-amplifier arrangement comprises an amplifier section comprising a plurality of amplifiers. Each amplifier has an input port operatively connected to a corresponding unique one of the output ports of the pulse modulator and an output port for outputting an output signal of the amplifier. The amplifier section further comprises a power-combining network operatively connected to the output ports of the amplifiers and arranged to combine the output signals from the amplifiers for generating an output signal of the power-amplifier arrangement.

The power-combining network may be a Doherty-type output network.

The power-amplifier arrangement may comprise one or more delay elements operatively connected between output ports of the pulse modulator and input ports of the amplifiers for compensating mutual delays, in the power-combining network, between output signals from the amplifiers.

The pulse modulator may be adapted to generate the signals on its output ports such that mutual delays, in the power-combining network, between output signals from the amplifiers are compensated.

The power-amplifier arrangement may comprise, for each amplifier in the amplifier section, a mixer operatively connected between the input port of the amplifier and the corresponding output port of the pulse modulator.

The pulse modulator may be adapted to perform quantization noise shaping.

The amplifiers may be biased to operate in class B or class C.

According to a second aspect, there is provided a radio-transmitter circuit comprising the power-amplifier arrangement according to the first aspect.

According to a third aspect, there is provided a radio-communication apparatus comprising the power-amplifier arrangement according to the first aspect. For example, the radio-communication apparatus may comprise the radio-transmitter circuit according to the second aspect, which in turn comprises the power-amplifier arrangement according to the first aspect. The radio-communication apparatus may e.g. be a radio base station or a mobile terminal.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
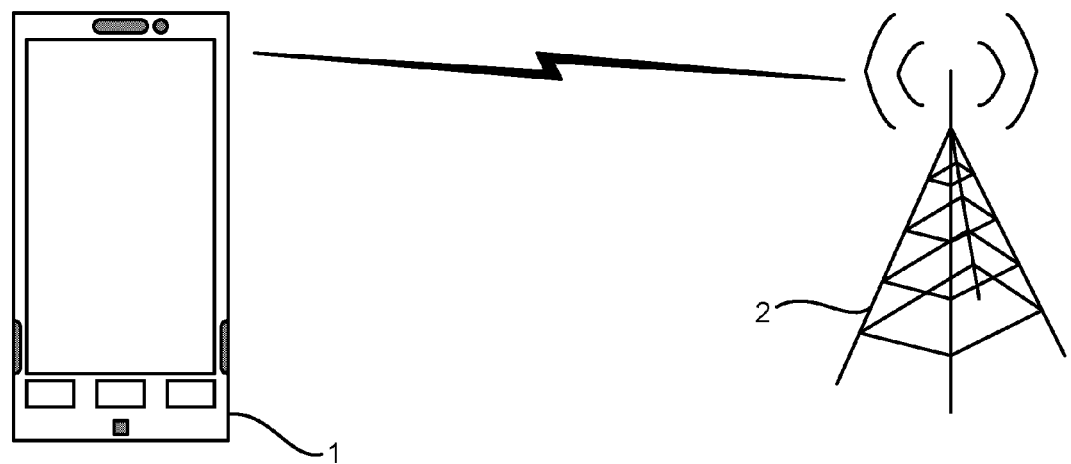
FIG. 1 schematically illustrates an environment where embodiments of the present invention may be employed.

FIG. 1 schematically illustrates an environment wherein embodiments of the present invention may be employed. A mobile terminal (MT) 1, such as a mobile phone, is operatively connected to a radio base station (BS) 2 over a wireless communication channel, for example in a cellular communication system. The MT 1 and the BS 2 are examples of what is generically referred to below as a radio-communication apparatus.

Figure 2:
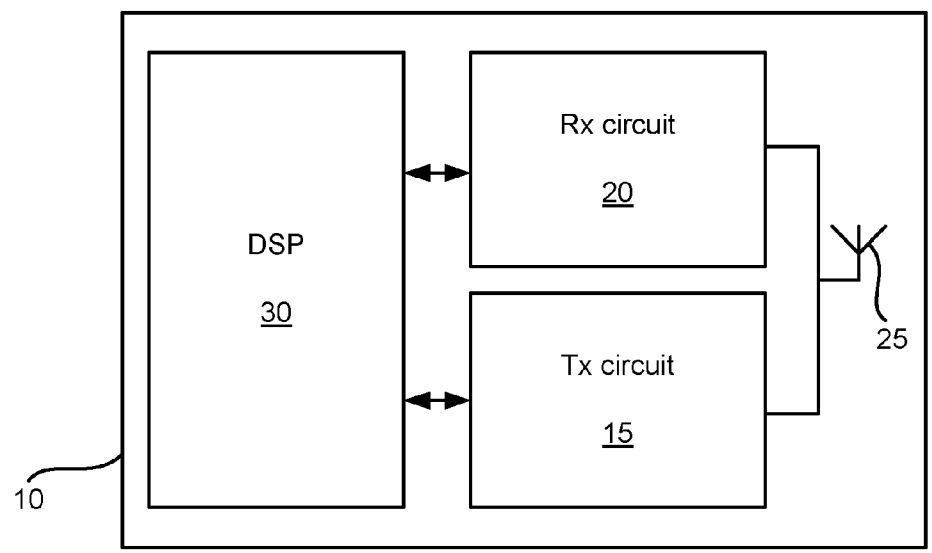
FIG. 2 is a simplified block diagram of a radio-communication apparatus according to an embodiment of the present invention.

FIG. 2 is a simplified block diagram of such a radio-communication apparatus 10 according to an embodiment of the present invention. In this embodiment, the radio-communication apparatus 10 comprises a radio-transmitter circuit 15 and a radio-receiver circuit 20. Furthermore, the radio-communication apparatus 10 may comprise one or more antennas for transmission and/or reception of radio signals. This is illustrated in FIG. 2 with a single antenna 25, which is shared between the radio-transmitter circuit 15 and the radio-receiver circuit 20. However, this is only an example and in other embodiments, the radio-communication apparatus 10 may comprise a plurality of antennas. Each such antenna could either be a dedicated transmit or receive antenna, or may be a combined transmit and receive antenna. Furthermore, in the embodiment illustrated in FIG. 2, the radio-communication apparatus 10 comprises a digital signal processing (DSP) unit 30, which is operatively connected to the radio-transmitter circuit 15 and the radio-receiver circuit 20, e.g. for providing input signals to the radio-transmitter circuit 15 and receiving output signals from the radio-receiver circuit 20. The DSP unit 30 may e.g. be adapted to perform what is commonly referred to as digital baseband processing.

Figure 3:
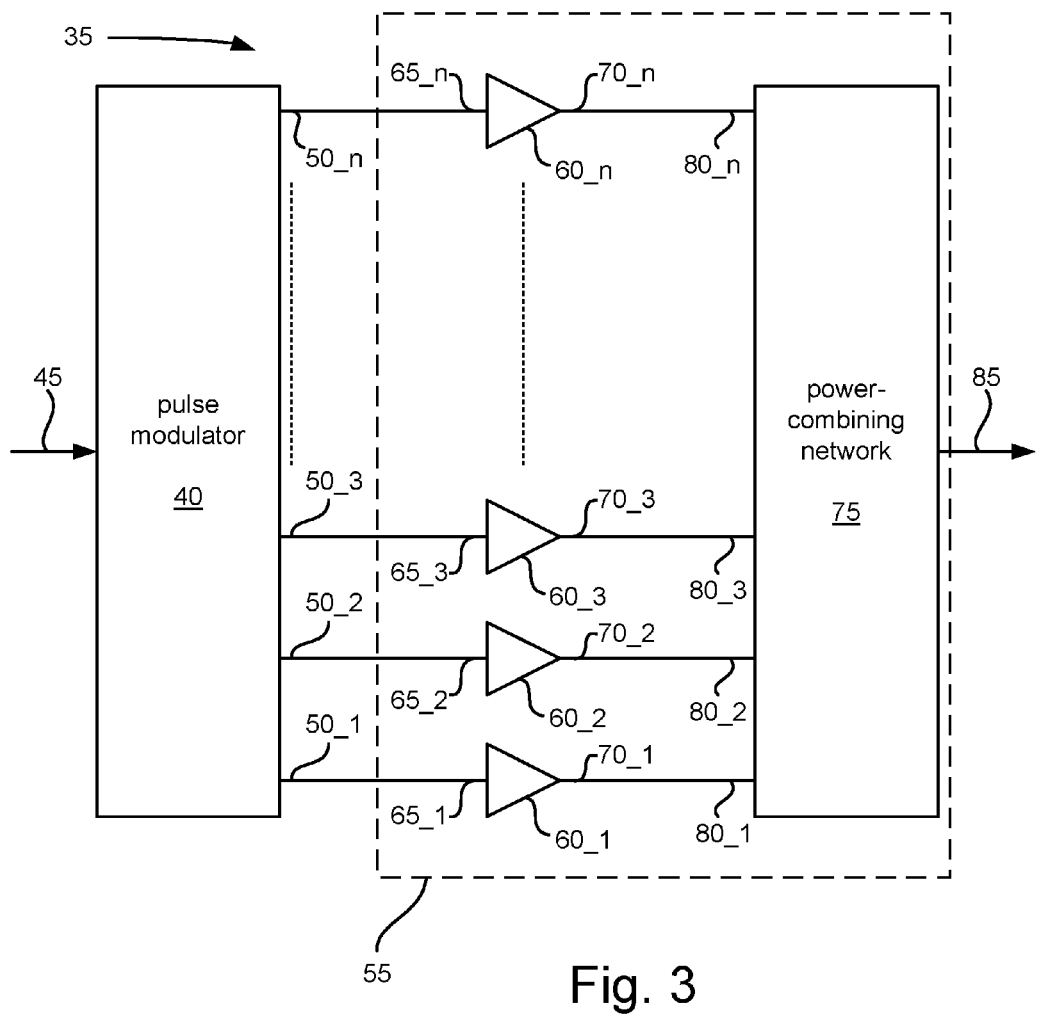
FIG. 3 is a block diagram of a power-amplifier arrangement according to an embodiment of the present invention.

The radio-transmitter circuit 15 comprises a power-amplifier (PA) arrangement for generating an output signal of the radio-transmitter circuit 15 with a relatively high power, which is fed to the antenna 25. FIG. 3 is a block diagram of such a PA arrangement 35 according to an embodiment of the present invention. The PA arrangement 35 comprises a pulse modulator 40 adapted to receive a digital input signal of the power-amplifier arrangement 35 on an input port 45 of the PA arrangement 35. Furthermore, the pulse modulator is adapted to generate, based on the digital input signal of the PA arrangement 35, an output signal of the pulse modulator 40 with a plurality of quantization levels. According to some embodiments, the pulse modulator 40 is adapted to generate the output signal by simply quantizing the digital input signal of the PA arrangement 35. According to other embodiments, the pulse modulator 40 may be adapted perform noise shaping, e.g. delta-sigma modulation, in conjunction with the quantization to move part of the quantization noise power outside of a signal frequency band of interest. Additionally or alternatively, the pulse modulator 40 may be adapted to perform various other signal processing tasks, e.g. frequency translation and/or filtering, for the generation of the output signal of the pulse modulator 40 based on the digital input signal of the PA arrangement 35. The pulse modulator 40 has a plurality of output ports 50_1-50_n for representing the output signal of the pulse modulator 40. Each output port 50_1-50_n of the pulse modulator is associated with a unique one of the quantization levels in the following way. When the output signal of the pulse modulator 40 equals or exceeds a particular quantization level, a signal output on the one of the output ports 50_1-50_n that is associated with that quantization level adopts a first state. Otherwise, said output signal adopts a second state. The first state may e.g. be represented with a first voltage level and the second state with a second voltage level, different from the first voltage level. Hence, for each of the output ports 50_1-50_n, the signal output thereon is a pulse train, the state of which depends on whether or not the output signal of the pulse modulator 40 equals or exceeds the quantization level associated with that output port 50_1-50_n. Furthermore, the output signal of the pulse modulator 40 is represented by the signals output on said output ports 50_1-50_n in combination (similar to a multi-bit representation of a digital signal).

In addition, in the embodiment of the PA arrangement 35 illustrated in FIG. 3, the PA arrangement 35 comprises an amplifier section 55. The amplifier section 55 comprises a plurality of amplifiers 60_1-60_n. Each amplifier 60_1-60_n has an input port 65_1-65_n operatively connected to a corresponding unique one of the output ports 50_1-50_n of the pulse modulator 40. In the embodiment illustrated in FIG. 3, the input port 65_i of the amplifier 60_i is operatively connected to the output port 50_i of the pulse modulator 40 for i=1, 2, ..., n. Furthermore, each amplifier 60_1-60_n has an output port 70_1-70_n for outputting an output signal of the amplifier 60_1-60_n. Since the signals input to the amplifiers 60_1-60_n are pulse trains, each of the amplifiers 60_1-60_n are effectively one-bit modulated amplifiers, which allows for a relatively high efficiency. This property can e.g. be utilized by biasing the amplifiers 60_1-60_n to operate in class B or class C, or other classes having a relatively high associated efficiency.

In addition, the embodiment of the PA arrangement 35 illustrated in FIG. 3 comprises a power-combining network 75 operatively connected to the output ports 70_1-70_n of the amplifiers 60_1-60_n with corresponding input ports 80_1-80_n of the power-combining network 75. The power-combining network 75 is arranged to combine the output signals from the amplifiers 60_1-60_n and thereby generate an output signal of the PA arrangement 35 on an output port 85 of the PA arrangement 35.

Tables 1 and 2 below illustrate how the output signal of the pulse modulator 40 may be represented on the output ports 50_1-50_n of the pulse modulator 40 according to two example embodiments. In both example embodiments, the number of output ports 50_1-50_4 is four. This is only an example, and other numbers of output ports may be used in other embodiments. Furthermore, in both examples, the quantized output signal of the pulse modulator 40 ranges from 0 to 1 in with five quantization levels. In table 1, the quantization levels are 0, 0.25, 0.5, 0.75, and 1, whereas in table 2, the quantization levels are 0, 0.2, 0.6, 0.825, and 1. These quantization levels are only examples, and other quantization levels may be used in other embodiments. For example, the quantization levels may be selected such as to minimize the expected quantization noise, e.g. based on a priori knowledge of typical signal distributions used in a particular application (in many communication applications, the distribution of an envelope of a communication signal may e.g. be assumed to have a Rayleigh distribution). Furthermore, it should be noted that the range 0 to 1 is only an arbitrary choice of range used for illustration, and that this range could be scaled to other ranges (while at the same time scaling the quantization levels accordingly), without actually changing the examples. The quantization level associated with a particular output port 50_1-50_4 is indicated within parentheses in the heading row associated with the output port 50_1-50_4. The first and second states of the signals output on the output ports 50_1-50_4 mentioned above are represented with the digits '1' (e.g. representing "on") and '0' (e.g. representing "off"), respectively. Using the digits '1' and '0' for representing the first and second state is also just an arbitrary choice used for illustration.

TABLE 1

| quantized output | representation on output ports | | | |
|---|---|---|---|---|
| | 50_4 (1) | 50_3 (0.75) | 50_2 (0.5) | 50_1 (0.25) |
| 0 | '0' | '0' | '0' | '0' |
| 0.25 | '0' | '0' | '0' | '1' |
| 0.5 | '0' | '0' | '1' | '1' |
| 0.75 | '0' | '1' | '1' | '1' |
| 1 | '1' | '1' | '1' | '1' |

TABLE 2

| quantized output | representation on output ports | | | |
|---|---|---|---|---|
| | 50_4 (1) | 50_3 (0.825) | 50_2 (0.6) | 50_1 (0.2) |
| 0 | '0' | '0' | '0' | '0' |
| 0.2 | '0' | '0' | '0' | '1' |
| 0.6 | '0' | '0' | '1' | '1' |
| 0.825 | '0' | '1' | '1' | '1' |
| 1 | '1' | '1' | '1' | '1' |

According to embodiments of the present invention, the quantization levels may (as illustrated with table 1) or may not (as illustrated with table 2) be equidistant. It can also be noted that in the embodiments illustrated in tables 1 and 2, each output port 50_1-50_4 has an associated quantization level, but that not all of the quantization levels have an associated output port. The quantization level 0 does not have an associated output port and is represented by setting each of the output signals output on the output ports 50_1-50_4 in the second state (represented with '0':s in tables 1 and 2).

In order to obtain a relatively good linearity in the amplifier section 55, the amplifiers 60_1-60_n may be designed such that a gain or weight (i.e. a factor with which the amplifier contributes to the output signal (e.g. output voltage or current) of the PA arrangement 35) of each amplifier 60_i is proportional, or approximately proportional, to the difference between the quantization level associated with the amplifier 60_i and the preceding quantization level. For example, for the embodiment illustrated with table 1, the gain or weight of all amplifiers 60_1-60_4 may be selected to be equal or approximately equal. Furthermore, for the embodiment illustrated with table 2, the gains or weights of the amplifiers 60_1, 60_2, 60_3, and 60_4 may be selected proportional, or approximately proportional, to 0.2 (=0.2−0), 0.4 (=0.6−0.2), 0.225 (=0.825−0.6), and 0.175 (=1−0.825), respectively.

Figure 4:
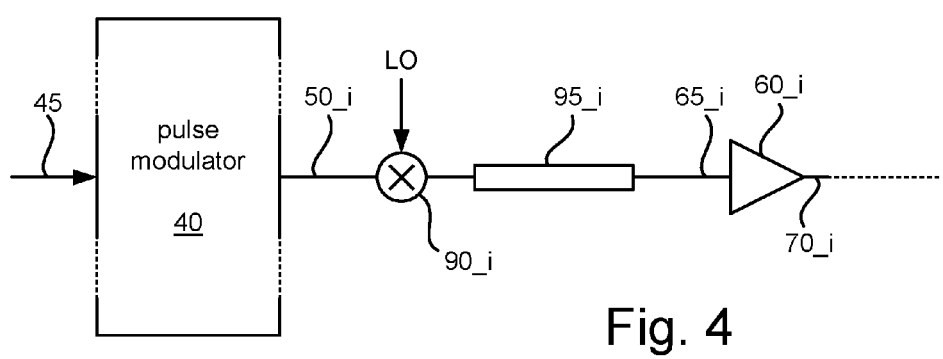
FIG. 4 is a block diagram of part of a power-amplifier arrangement according to an embodiment of the present invention.

In FIG. 3, the connection between the pulse modulator 40 and an amplifier 60_i is illustrated as a direct connection. However, according to some embodiments, one or more intervening elements may be present in the signal path between the pulse modulator 40 and an amplifier 60_i, e.g. as illustrated in FIG. 4. For example, in some embodiments, the pulse modulator 40 may be adapted to generate the output signal of the pulse modulator 40 at with a frequency different from the radio frequency (RF) to be used for the output signal from the PA arrangement 35. For example, the output signal from the pulse modulator 40 may be a baseband signal or an intermediate-frequency (IF) signal. In that case, the PA arrangement 35 may comprise a mixer 90_i operatively connected between the input port 65_i of the amplifier 60_i and the corresponding output port 50_i of the pulse modulator 40 for each amplifier 60_1-60_n of the amplifier section 55. The mixer 90_i may be driven by a local-oscillator (LO) signal with an appropriate frequency to perform the frequency translation to the desired RF frequency. According to an embodiment of the present invention, the LO signal is phase-modulated based on information to be transmitted. Hence, in this embodiment, a combination of phase and amplitude modulation in the output signal of the PA arrangement 35 can be obtained by providing the amplitude modulation by means of the pulse modulator and the phase modulation by means of the phase-modulated LO signal.

According to other embodiments, the pulse modulator 40 may be adapted to generate the output signal of the pulse modulator 40 directly at the desired RF frequency, whereby the mixers 90_i are not needed. For example, the digital input signal of the PA arrangement 35 may already be at the correct RF frequency. Alternatively, the pulse modulator 40 may be adapted to perform frequency translation to the RF frequency.

Furthermore, in the power-combining network 75, there may exist a mutual delay between the output signals from the different amplifiers 60_1-60_n, e.g. caused by difference between the signal paths from the different input ports 80_1-80_n of the power-combining network 75 to the output port 85 of the power-combining network 75. Such mutual delays occur e.g. when the power-combining network 75 is implemented as a Doherty-type output network (described below with reference to FIG. 5). In order to compensate for such a delay, the PA arrangement may comprise one or more delay element 95_i operatively connected between output ports 50_1-50_n of the pulse modulator 40 and input ports 65_1-65_n of the amplifiers 60_1-60_n. The delay elements 95_i may e.g. be implemented with microstrips, or other types of transmission lines, having suitable lengths. Alternatively, the pulse modulator 40 may be adapted to generate the signals on its output ports 50_1-50_n such that such mutual delays are compensated. Hence, in such embodiments, the states of signals output on the different output ports 50_1-50_n are not all updated simultaneously, but there may be a mutual delay between the updating of the states of said signals between some or all of the output ports 50_1-50_n.

Figure 5:
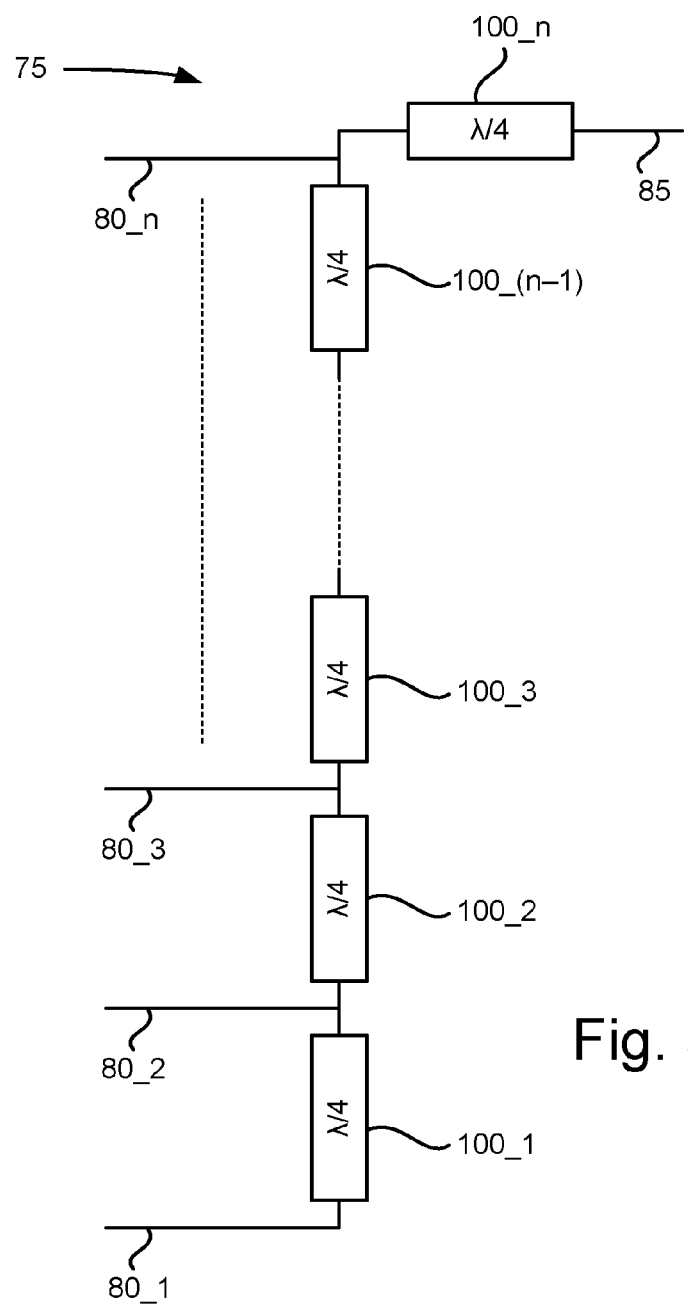
FIG. 5 is a schematic circuit diagram of a power-combining network according to an embodiment of the present invention.

The inventors have realized that a Doherty-type output networks are suitable for use as the power-combining network 75. Hence, in accordance with some embodiments of the present invention, the power-combining network 75 is a Doherty-type output network. An embodiment of the power-combining network 75 implemented as such a Doherty-type output network is illustrated in FIG. 5. According to the embodiment, the power-combining network comprises a plurality of series-connected transmission lines 100_1-100_n of length $\lambda/4$ (where $\lambda$ is the wavelength corresponding to the RF frequency used in the PA arrangement 35). The transmission lines 100_1-100_n may e.g. be implemented as microstrips. Furthermore, as illustrated in FIG. 5, each one of the input ports 80_1-80_n of the power-combining network 75 are connected to an end of a corresponding transmission line 100_1-100_n; the input port 80_1 is connected to the "free" end of the transmission line 100_1, and for the remaining input ports 80_2-80_n, the input port 80_i is connected to the end of the transmission line 100_i that is also connected to the transmission line 100_(i-1). Moreover, the output port 85 of the power-combining network 75 is connected to the "free" end of the transmission line 100_n.

Implementing the power-combining network 75 as a Doherty-type output network further facilitates a relatively high efficiency in the PA arrangement 35, in a similar manner as a for a Doherty type PA. For example, a relatively high efficiency may be obtained for a relatively wide range of output power. The amplifier 60_1 (FIG. 3) can be considered to correspond to a main amplifier of a conventional Doherty-type PA, and the other amplifiers 60_2-60_n can be considered to correspond to peak amplifiers of a conventional Doherty-type PA. A difference between embodiments of the PA arrangement 35 and a conventional Doherty-type amplifier is that each of the amplifiers 60_1-60_n are separately driven by one-bit quantized signals output from the pulse modulator 40. This makes the PA arrangement 35 less sensitive to manufacturing and biasing inaccuracies in the amplifiers 60_1-60_n, compared with the sensitivity to corresponding inaccuracies in corresponding amplifiers in a conventional Doherty-type PA, which may require relatively good biasing and manufacturing accuracy for obtaining correct turn-on points for peak amplifiers. In conventional, linearly driven Doherty amplifiers, said turn-on points are crucial for linearity. This is not an issue for the PA arrangement 35 in accordance with embodiments of the present invention, since the turn-on of the various amplifiers 60_1-60_n (FIG. 3) is controlled digitally from the pulse modulator 40 by means of said one-bit quantized signals.

Figure 6:
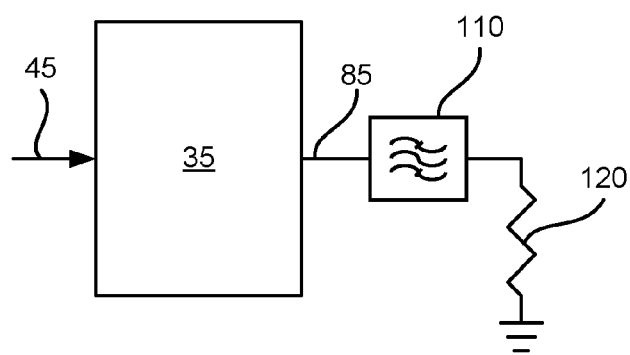
FIG. 6 illustrates a power-amplifier arrangement connected to a load via a filter according to an embodiment of the present invention.

FIG. 6 illustrates an example where the PA arrangement 35 is connected, with its output port 85, to a load 120 (represented in FIG. 6 with a resistor) via a band pass reconstruction filter 110. The circuitry illustrated in FIG. 6 may e.g. form part of the radio transmitter circuit 15 in FIG. 2. Compared with a (single) switched-mode PA driven with a one-bit modulated signal (discussed in the background section), the resulting quantization noise power may be considerably lower in embodiments of the PA arrangement 35 due to the use of more amplifiers and quantization levels. Thereby, the requirements on the band pass reconstruction filter 110 can be relaxed, which is an advantage. Alternatively, if the number of amplifiers 60_1-60_n is large enough, and the quantization levels are appropriately selected, the quantization noise may be low enough such that the band-pass reconstruction filter 110 may be omitted altogether. What is considered "large/low enough" and "appropriately selected" in this context depends on the application, e.g. depending on system specifications, and should be considered on a case by case basis.

In the background section, it was mentioned that, for the case of a (single) switched-mode PA driven by a one-bit modulated signal, the band-pass reconstruction filter normally presents a load to the amplifier that varies with the duty-cycle, whereby the efficiency will drop for low duty cycles. For embodiments of the PA arrangement 35, where multiple amplifiers 60_1-60_n driven by one-bit quantized signals are employed, this problem may be reduced or eliminated, at least for embodiments where the power-combining network 75 is implemented as a Doherty-type network as described above. This is because residual charge in the band-pass reconstruction filter (e.g. band-pass reconstruction filter 110 in FIG. 6) is short-circuited during the "off-state" (i.e. when all amplifiers 60_1-60_n (FIG. 3) are turned off due to a zero output from the pulse modulator 40), whereby an overall constant or approximately constant load is presented to the PA arrangement 35. This is obtained by means of the impedance-inversion property of the λ/4 transmission lines 100_1-100_n, which provides for a short circuiting as seen from the input of the band-pass reconstruction filter 110 even if all amplifiers 60_1-60_n are switched off (thereby presenting an open circuit at their respective output ports 70_1-70_n).

The present invention has been described above with reference to specific embodiments. However, other embodiments than the above described are possible within the scope of the invention. The different features of the embodiments may be combined in other combinations than those described. The scope of the invention is only limited by the appended patent claims.

The invention claimed is:

1. A power-amplifier arrangement comprising:
a pulse modulator configured to receive a digital input signal of the power-amplifier arrangement and generate, based on the digital input signal of the power-amplifier arrangement, an output signal of the pulse modulator with a plurality of quantization levels;
wherein the pulse modulator has a plurality of output ports for representing the output signal of the pulse modulator and each output port of the pulse modulator is associated with a unique one of the quantization levels such that a signal output on the output port adopts: a first state when the output signal of the pulse modulator equals or exceeds the associated quantization level; or otherwise adopts a second state; and
an amplifier section comprising:
a plurality of amplifiers, wherein each amplifier has an input port operatively connected to a corresponding unique one of the output ports of the pulse modulator, and an output port for outputting an output signal of the amplifier; and
a power-combining network operatively connected to the output ports of the amplifiers and arranged to combine the output signals from the amplifiers for generating an output signal of the power-amplifier arrangement.

2. The power-amplifier arrangement according to claim 1, wherein the power-combining network is a Doherty-type output network.

3. The power-amplifier arrangement according to claim 1, further comprising one or more delay elements operatively connected between output ports of the pulse modulator and input ports of the amplifiers for compensating mutual delays in the power-combining network, between output signals from the amplifiers.

4. The power-amplifier arrangement according to claim 1, wherein the pulse modulator is configured to generate the signals on its output ports such that mutual delays in the power-combining network, between output signals from the amplifiers, are compensated.

5. The power-amplifier arrangement according to claim 1, further comprising, for each amplifier in the amplifier section, a mixer operatively connected between the input port of the amplifier and the corresponding output port of the pulse modulator.

6. The power-amplifier arrangement according to claim 1, wherein the pulse modulator is configured to perform quantization noise shaping.

7. The power-amplifier arrangement according claim 1, wherein the amplifiers are biased to operate as Class B or Class C amplifiers.

8. A radio-transmitter circuit including a power-amplifier arrangement comprising:
a pulse modulator configured to receive a digital input signal of the power-amplifier arrangement and generate, based on the digital input signal of the power-amplifier arrangement, an output signal of the pulse modulator with a plurality of quantization levels;
wherein the pulse modulator has a plurality of output ports for representing the output signal of the pulse modulator and each output port of the pulse modulator is associated with a unique one of the quantization levels such that a signal output on the output port adopts: a first state when the output signal of the pulse modulator equals or exceeds the associated quantization level; or otherwise adopts a second state; and
an amplifier section comprising:
a plurality of amplifiers, wherein each amplifier has an input port operatively connected to a corresponding unique one of the output ports of the pulse modulator, and an output port for outputting an output signal of the amplifier; and
a power-combining network operatively connected to the output ports of the amplifiers and arranged to combine the output signals from the amplifiers for generating an output signal of the power-amplifier arrangement.

9. A radio-communication apparatus including a power-amplifier arrangement comprising:

a pulse modulator configured to receive a digital input signal of the power-amplifier arrangement and generate, based on the digital input signal of the power-amplifier arrangement, an output signal of the pulse modulator with a plurality of quantization levels;

wherein the pulse modulator has a plurality of output ports for representing the output signal of the pulse modulator and each output port of the pulse modulator is associated with a unique one of the quantization levels such that a signal output on the output port adopts: a first state when the output signal of the pulse modulator equals or exceeds the associated quantization level; or otherwise adopts a second state; and an amplifier section comprising:
  a plurality of amplifiers, wherein each amplifier has an input port operatively connected to a corresponding unique one of the output ports of the pulse modulator, and an output port for outputting an output signal of the amplifier; and
  a power-combining network operatively connected to the output ports of the amplifiers and arranged to combine the output signals from the amplifiers for generating an output signal of the power-amplifier arrangement.

10. The radio-communication apparatus according to claim 9, wherein the radio-communication apparatus is a radio base station.

11. The radio-communication apparatus according to claim 9, wherein the radio-communication apparatus is a mobile terminal.

* * * * *

UNITED STATES PATENT AND TRADEMARK OFFICE
CERTIFICATE OF CORRECTION

| | | |
|---|---|---|
| PATENT NO. | : 8,659,354 B2 | Page 1 of 1 |
| APPLICATION NO. | : 13/581556 | |
| DATED | : February 25, 2014 | |
| INVENTOR(S) | : Gustavsson et al. | |

It is certified that error appears in the above-identified patent and that said Letters Patent is hereby corrected as shown below:

On the Title Page, Item (73), Assignee, please change "Stockholm" to --Stockholm (SE)--.

Signed and Sealed this
Thirteenth Day of May, 2014

Michelle K. Lee
*Deputy Director of the United States Patent and Trademark Office*